(12) United States Patent
Zhu et al.

(10) Patent No.: US 10,553,771 B2
(45) Date of Patent: Feb. 4, 2020

(54) HIGH FIGURE OF MERIT P-TYPE FENBHFSB THERMOELECTRIC MATERIALS AND THE PREPARATION METHOD THEREOF

(71) Applicant: ZHEJIANG UNIVERSITY, Hangzhou, Zhejiang Province (CN)

(72) Inventors: Tiejun Zhu, Hangzhou (CN); Chenguang Fu, Hangzhou (CN); Xinbing Zhao, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 263 days.

(21) Appl. No.: 15/539,316

(22) PCT Filed: Jul. 16, 2015

(86) PCT No.: PCT/CN2015/084262
§ 371 (c)(1),
(2) Date: Jun. 23, 2017

(87) PCT Pub. No.: WO2016/127572
PCT Pub. Date: Aug. 18, 2016

(65) Prior Publication Data
US 2018/0331268 A1 Nov. 15, 2018

(30) Foreign Application Priority Data
Feb. 12, 2015 (CN) .......................... 2015 1 0073138

(51) Int. Cl.
*H01L 35/18* (2006.01)
*C22C 1/04* (2006.01)
*C22C 30/00* (2006.01)

(52) U.S. Cl.
CPC ................ *H01L 35/18* (2013.01); *C22C 1/04* (2013.01); *C22C 30/00* (2013.01)

(58) Field of Classification Search
CPC ........... H01L 35/18; C22C 1/04; C22C 30/00; C22C 33/02; C22C 33/0278; B22F 2998/10; B22F 2999/00
(Continued)

(56) References Cited

U.S. PATENT DOCUMENTS
2008/0066798 A1 3/2008 Sakurada et al.

FOREIGN PATENT DOCUMENTS
| CN | 1354274 A | 6/2002 |
|---|---|---|
| CN | 102119063 A | 7/2011 |
| CN | 104124332 A | 10/2014 |

OTHER PUBLICATIONS

Kimura, Thermoelectric Properties of Directionally Solidified Half-Heusler (M0.5 a ,M0.5 b )NiSn (Ma ,Mb = Hf, Zr, Ti) Alloys, Feb. 28, 2009, Journal of Electronic Materials, vol. 38, pp. 934-939 (Year: 2009).*
(Continued)

*Primary Examiner* — Anthony J Zimmer
*Assistant Examiner* — Ricardo D Morales
(74) *Attorney, Agent, or Firm* — Jiwen Chen

(57) ABSTRACT

The present invention discloses a type of high figure of merit p-type FeNbHfSb thermoelectric material, whose composition is $FeNb_{1-x}Hf_xSb$, wherein x=0.06~0.2. The present invention also discloses the method to prepare these p-type FeNbHfSb thermoelectric materials. The ingots with nominal composition $FeNb_{1-x}Hf_xSb$ are prepared by levitation melting of stoichiometric amounts of Fe, Nb, Hf and Sb under an argon atmosphere. The obtained ingots are mechanically milled to get submicron-scale powders. The obtained powders are compacted by spark plasma sintering to obtain the final bulk p-type FeNbHfSb thermoelectric materials. The compositional elements of these p-type FeNbHfSb thermoelectric materials are abundant in the earth
(Continued)

crust. The p-type thermoelectric materials also shows good high temperature stability and the preparation method are simple and high-yield. Therefore, the industrial production cost would be relatively cheap. The maximum zT value of the p-type thermoelectric materials is ~1.45 at 1200K, which is the highest value among the p-type half-Heusler system.

7 Claims, 4 Drawing Sheets

(58) Field of Classification Search
USPC .......................................................... 420/581
See application file for complete search history.

(56) References Cited

OTHER PUBLICATIONS

Young, D. P., et al. "Thermoelectric properties of pure and doped FeMSb (M= V, Nb)." Journal of Applied Physics 87.1 (2000): 317-321. (Year: 2000).*
Fu, Chenguang, et al. "Thermoelectric properties of FeVSb half-Heusler compounds by levitation melting and spark plasma sintering." Intermetallics 32 (2012): 39-43. (Year: 2012).*
Young et al. (Thermoelectric properties of pure and doped FeMSb, Journal of Applied Physics 87, 317-321 (2000) (Year: 2000).*
Kimura et al. (Thermoelectric Properties of Directionally Solidified Hal-Heusler NSn Alloys, Journal of Electronic Materials, vol. 38, pp. 934-939 (2009)) (Year: 2009).*

* cited by examiner

HIGH FIGURE OF MERIT P-TYPE FENBHFSB THERMOELECTRIC MATERIALS AND THE PREPARATION METHOD THEREOF

This is a U.S. national stage application of PCT Application No. PCT/CN2015/084262 under 35 U.S.C. 371, filed Jul. 16, 2015 in Chinese, claiming priority of Chinese Application No. 201510073138.9, filed Feb. 12, 2015, all of which are hereby incorporated by reference.

FIELD OF THE TECHNOLOGY

The present invention is directed to thermoelectric materials, and specifically to high figure of merit p-type FeNbHfSb thermoelectric material and the preparation method thereof.

BACKGROUND OF THE INVENTION

Thermoelectric material, which can reversibly convert heat into electricity through the transport of internal carriers (electrons or holes), is a type of semiconductor material. If there is a temperature difference across the thermoelectric material, heat energy can be converted into electricity, which is called the Seebeck effect. As a contrast, if there is an electric field across the thermoelectric material, the electricity can be converted into heat energy, which leads to heat releasing on one side of the material while the other side will absorb heat energy. This is called the Peltier effect. Herein, thermoelectric materials can be widely used as power generation or cooling application based on the above two effects.

Generation devices made by the thermoelectric materials can be used as the power source of deep spacecraft, fieldwork, ocean lighthouse and nomadic people or directly convert industrial waste heat into electricity. Refrigeration devices made by thermoelectric material have many advantages, such as small volume and no need of chemical mediator, which can be applied as local cooling in the fields of mini freezers, computer chips, laser detectors and medical portable ultra-low temperature freezers. A wider application of thermoelectric refrigeration will also include household refrigerators, vehicle or home air conditioners. The devices made by the thermoelectric materials have many advantages such as no mechanical moving parts, no noise, no wear, simple structure and the shape or size can be designed according to the user needs.

The efficiency of a thermoelectric material is gauged by the figure of merit, zT, which is defined by:

$$zT=(a^2\sigma T/\kappa)$$

where a, $\sigma$, T and $\kappa$ are the Seebeck coefficient, electrical conductivity, absolute temperature, and thermal conductivity, respectively.

A good thermoelectric material should have high Seebeck coefficient and electrical conductivity and low thermal conductivity. High performance thermoelectric devices usually consist of high figure of merit n-type and p-type materials which should have close thermoelectric properties and crystal structure.

Nowadays, high-temperature thermoelectric materials have important applications in the fields of automotive industry, waste heat recovery and deep space satellites. The typical high-temperature thermoelectric materials are SiGe alloys, which have superior n-type thermoelectric performance with high zT of about 1.0. However, the corresponding p-type SiGe materials have relatively inferior thermoelectric performance with a low zT of about 0.5.

Recently, Half-Heusler compounds, which are consisted of earth-abundant elements, have attracted the attention of researchers in the thermoelectric field due to their excellent electrical properties. Among them, the n-type ZrNiSn-based half-Heusler compounds display high zT of about 1.0, which is comparable with the best n-type SiGe alloys. However, the p-type Half-Heusler compounds have relatively bad performance, which is a difficult problem hindering the application of Half-Heusler system as high-temperature power generation.

The raw materials of FeNbHfSb thermoelectric materials are consisted of earth-abundant and low cost elements. However, few studies can be found for this type of thermoelectric materials.

SUMMARY OF THE INVENTION

The present invention provides a type of high figure of merit p-type FeNbHfSb based thermoelectric material and the fabrication method thereof. A maximum zT of about 1.45 at 1200K can be found for the thermoelectric material.

The present invention discloses a type of high figure of merit p-type thermoelectric material: FeNbHfSb, which has the formulation of $FeNb_{1-x}Hf_xSb$, where x=0.06-0.2, x represents the atomic percentage.

Preferably, x=0.1-0.16, the zT of which is higher than 1.1; more preferably, x=0.12-0.14, the zT of which is higher than 1.4, and the maximum zTs of x=0.12 and x=0.14 are of 1.45 at 1200K, which can be good candidate of high temperature power generation.

The present invention also discloses the preparation method of this type of p-type FeNbHfSb thermoelectric material, which is shown as below:

(1) The ingots with nominal composition $FeNb_{1-x}Hf_xSb$ are prepared by levitation melting of stoichiometric amounts of Fe, Nb, Hf, Sb under an argon atmosphere.

(2) The ingots are pulverized and then sintered to obtain the bulk p-type FeNbHfSb thermoelectric materials.

Preferably, in step (1), the ingots are melted 2-5 times (more preferably, 3 times) to ensure homogeneity.

Preferably, in step (2), the particle size of the pulverized powders are in the range of 200 nm~10.0 µm; more preferably, 200 nm~2.0 µm. The smaller grain size of the powders is beneficial for lower thermal conductivity and higher thermoelectric performance.

Preferably, in step (2), the powders are sintered by spark plasma sintering at 800° C.-900° C. for 10 minutes-15 minutes under 60 MPa-70 MPa to obtain the bulk p-type FeNbHfSb thermoelectric materials. More preferably, the powders are sintered at 850° C. for 10 minutes under 65 MPa. If the sintering temperature is too low or the pressure is too small, the obtained bulk materials will have lower density, which may decrease the electrical conductivity and lead to lower thermoelectric performance. The sintering time cannot be too long, otherwise the grain size will be larger, leading to increased thermal conductivity and lower thermoelectric performance.

Compared with previous results, the benefits for the present invention are as follows:

In the present invention, a type of high figure of merit p-type FeNbHfSb based thermoelectric material is reported, which has a maximum zT of 1.45 at 1200K. This result is the highest value among the p-type half-Heusler compounds. The compositional elements of the FeNbHfSb thermoelectric material are relatively earth abundant and low cost. This FeNbHfSb thermoelectric material is of good thermal stability, easy fabrication, short productivity period, and high product efficiency.

DETAILED DESCRIPTION OF THE PREFERRED EMBODIMENTS

Based on the embodiments, further elaboration of the present invention is shown as below.

Embodiment 1

The ingot with nominal composition FeNb$_{0.86}$Hf$_{0.14}$Sb was prepared by levitation melting (positive high frequency electromagnetic suspension melting) of stoichiometric amounts of Fe, Nb, Hf and Sb under an argon atmosphere. The ingot was melted three times to ensure homogeneity. The obtained ingot was mechanically milled to obtain submicron-scale powders (200 nm-2.0 μm in diameter). Then, the obtained powders were compacted by spark plasma sintering at 850° C. for 10 minutes under 65 MPa to obtain the final bulk material.

Figure 1:
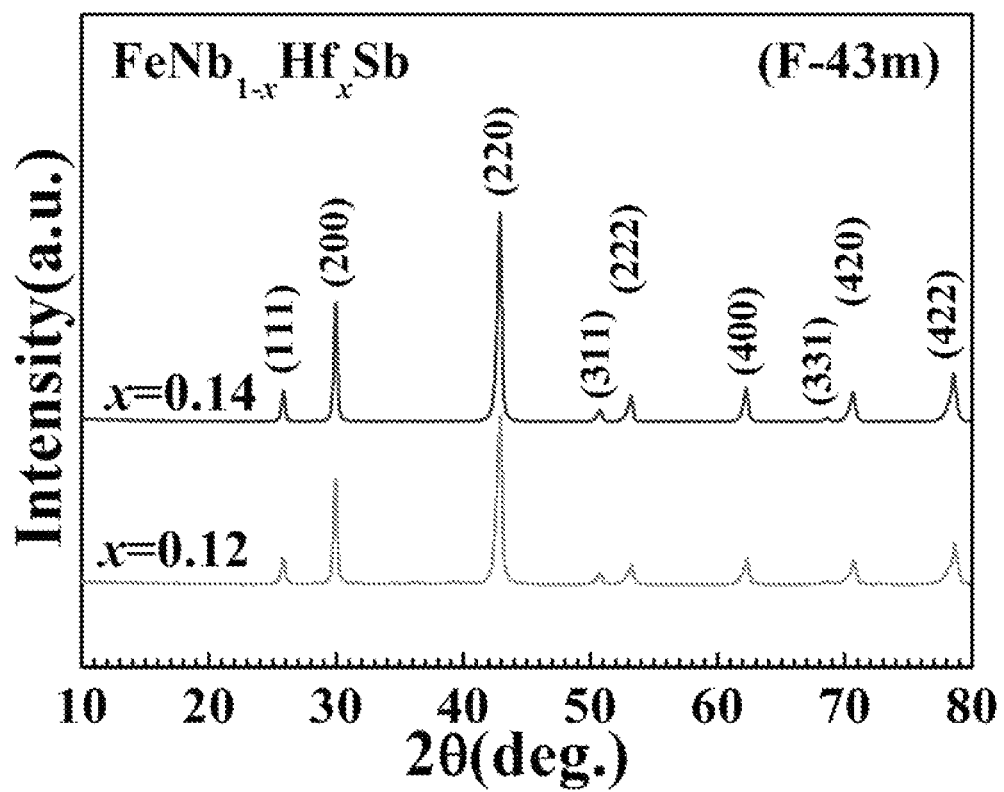
FIG. 1 shows the XRD patterns of FeNb$_{0.86}$Hf$_{0.14}$Sb prepared by embodiment 1 and FeNb$_{0.88}$Hf$_{0.12}$Sb prepared by embodiment 2.
Figure 2A:
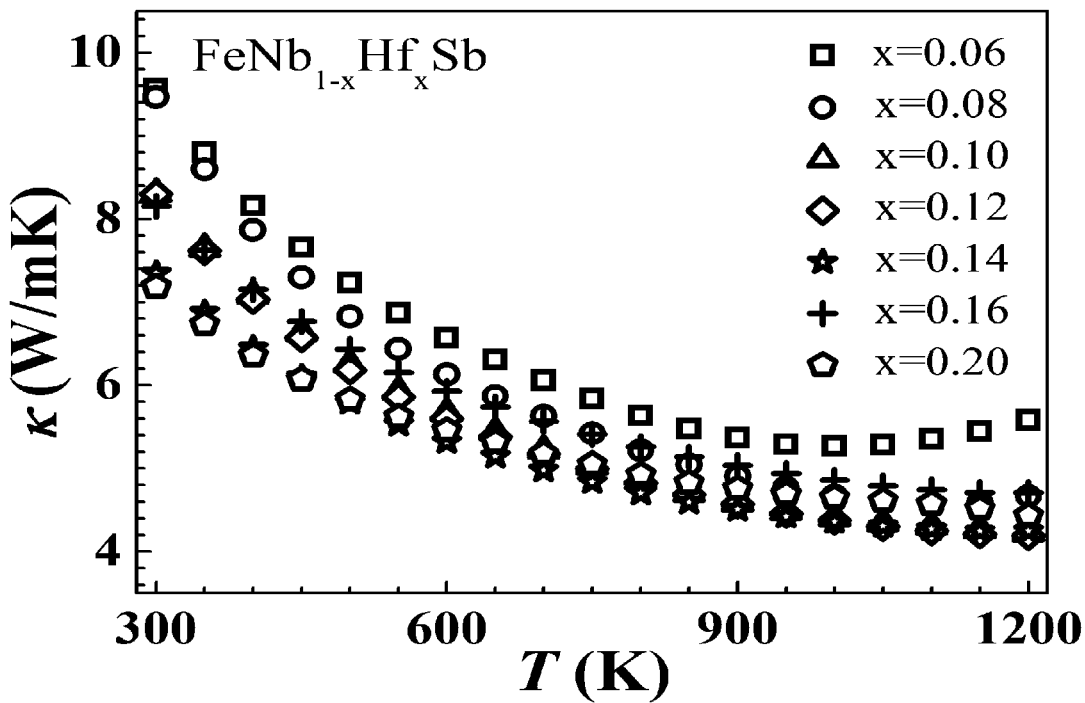
FIG. 2a shows the temperature dependence of thermal conductivity κ for FeNb$_{1-x}$Hf$_x$Sb prepared in embodiments 1-7.
Figure 2B:
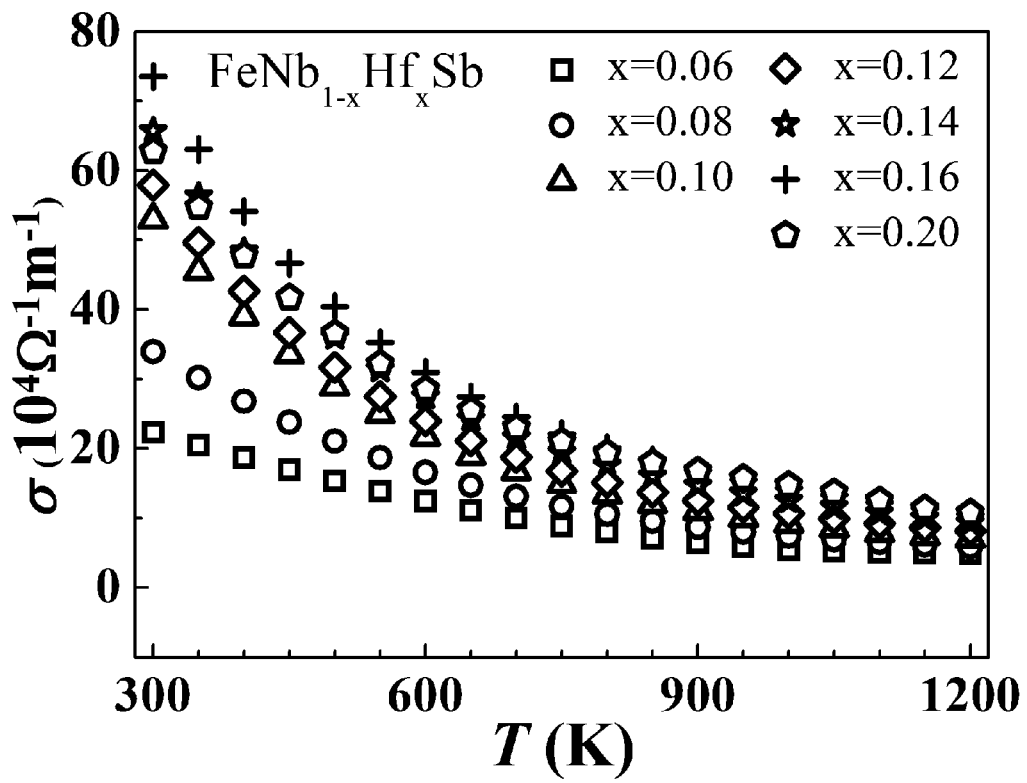
FIG. 2b shows the temperature dependence of electrical conductivity σ for FeNb$_{1-x}$Hf$_x$Sb prepared in embodiments 1-7.
Figure 2C:
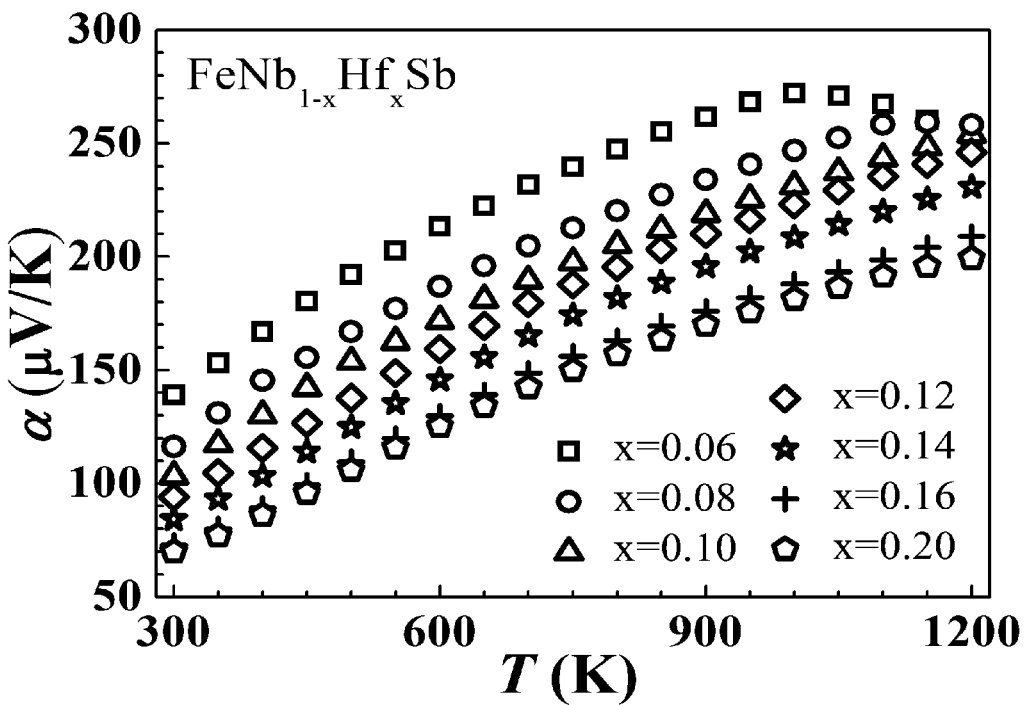
FIG. 2c shows the temperature dependence of Seebeck coefficient a for FeNb$_{1-x}$Hf$_x$Sb prepared in embodiments 1-7.
Figure 2D:
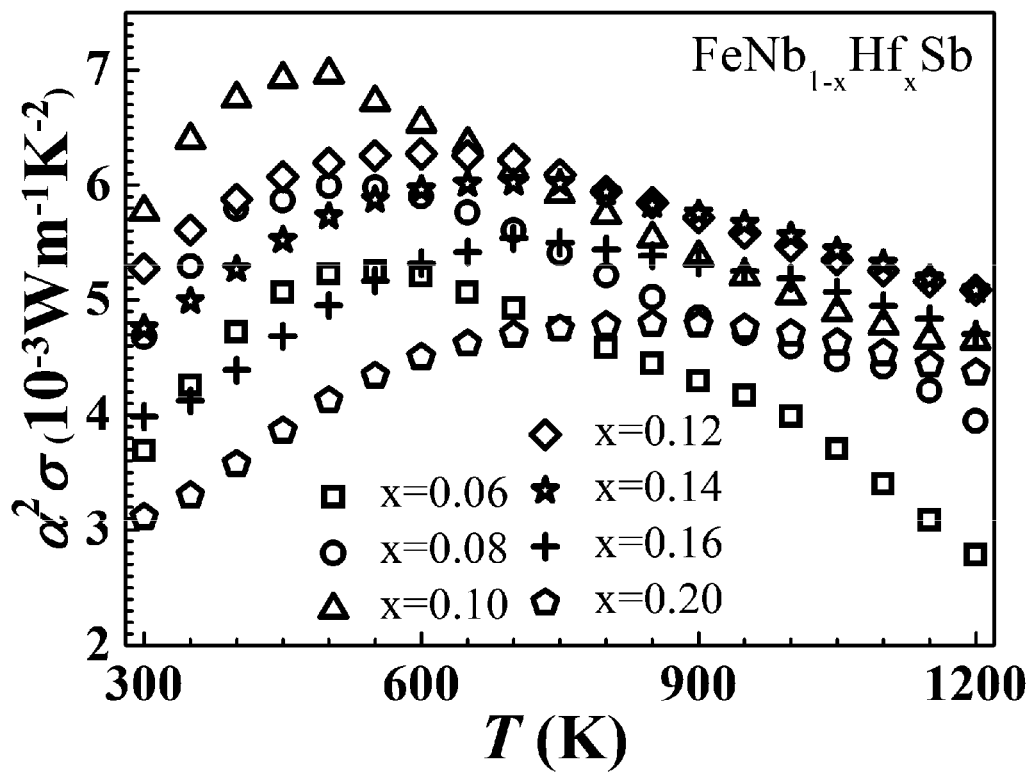
FIG. 2d shows the temperature dependence of power factor a$^2$σ for FeNb$_{1-x}$Hf$_x$Sb prepared in embodiments 1-7.

Phase structures of the sample were investigated by X-ray diffraction (XRD) on a RigakuD/MAX-2550PC diffractometer. The XRD pattern showed FeNbSb basic structure, a cubic structure (F43m), space group 216, as shown in FIG. 1.

The thermal diffusivity and specific heat of the sample were respectively measured by a laser flash method on a Netzsch LFA457 instrument and a Netzsch DSC-404 instrument. Then the thermal conductivity was calculated. The thermal conductivity κ of the sample was 4.25 Wm$^{-1}$K$^{-1}$ at 1200K.

The Seebeck coefficient and electrical conductivity of the sample were measured on a commercial Linseis LSR-3 system. At 1200K, the Seebeck coefficient a was 230.8 μV/K while the electrical conductivity σ was 9.6×10$^4$ S/m.

According to the above values and the formula zT=(a$^2$σT/κ), the zT value of the sample was 1.45 at 1200K.

Figure 4:
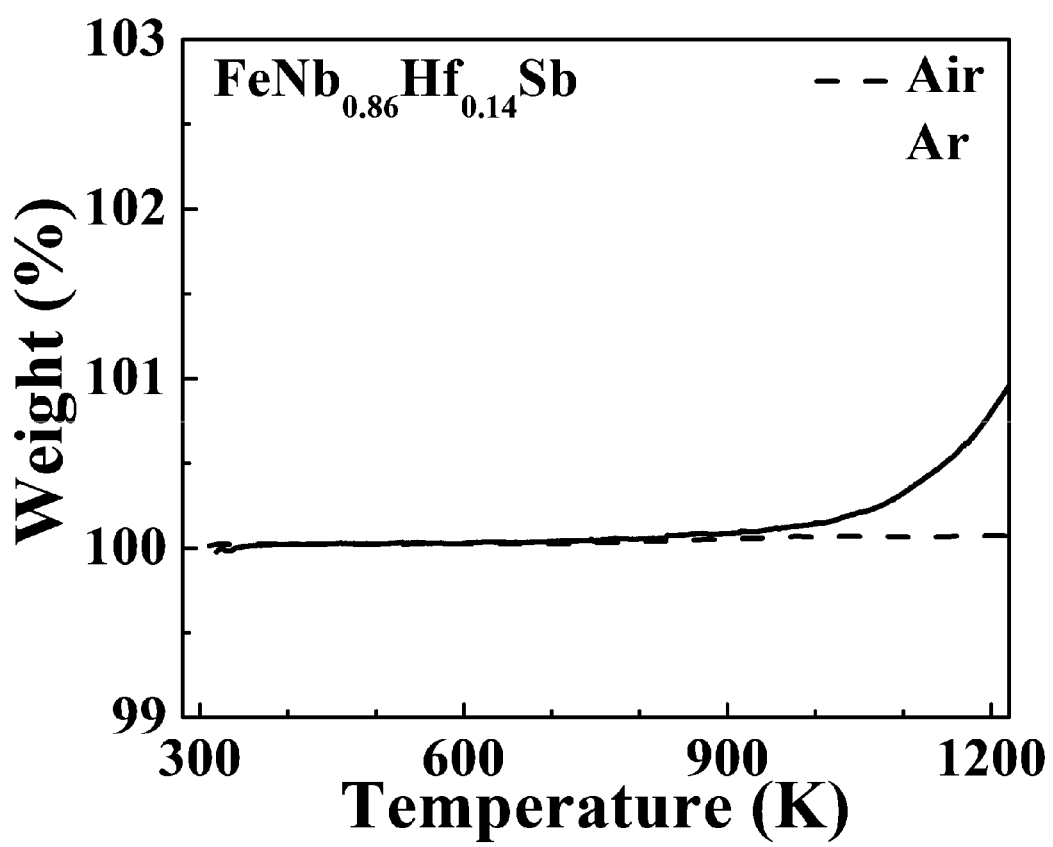
FIG. 4 shows the thermogravimetric analysis for FeNb$_{0.86}$Hf$_{0.14}$Sb prepared in embodiment 1.

Thermogravimetric analysis of the sample was carried out respectively in the nitrogen and air atmosphere by employing the DSCQ1000 equipment. The results were showed in FIG. 4. The heating rate was 15K/min while the measured temperature ranged from 300K to 1200K. The sample kept stable both under the nitrogen or air atmosphere from 300K to 900K, indicating good high-temperature stability. The sample still kept stable above 900K when heating in the nitrogen atmosphere while slight weight gain was found when heating in the air atmosphere, which may result from the surface oxidation.

Embodiment 2

The ingot with nominal composition FeNb$_{0.88}$Hf$_{0.12}$Sb was prepared by levitation melting of stoichiometric amounts of Fe, Nb, Hf and Sb under an argon atmosphere. The ingot was melted three times to ensure homogeneity. The obtained ingot was mechanically milled to obtain submicron-scale powders (200 nm-2.0 μm in diameter). Then, the obtained powders were compacted by spark plasma sintering at 850° C. for 10 minutes under 65 MPa to obtain the final bulk material.

Phase structures of the sample was investigated by X-ray diffraction (XRD) on a RigakuD/MAX-2550PC diffractometer. The XRD pattern showed FeNbSb basic structure, a cubic structure (F43m), space group 216, as shown in FIG. 1.

The thermal conductivity κ of the sample FeNb$_{0.88}$Hf$_{0.12}$Sb was 4.19 Wm$^{-1}$K$^{-1}$ at 1200K.

The Seebeck coefficient a and electrical conductivity σ of the sample FeNb$_{0.88}$Hf$_{0.12}$Sb were measured on a commercial Linseis LSR-3 system, which were respectively 246 μV/K and 8.4×10$^4$ S/m at 1200K.

According to the above values and the formula zT=(a$^2$σT/κ), the zT value of the sample FeNb$_{0.88}$Hf$_{0.12}$Sb was 1.46 at 1200K.

Embodiment 3

The ingot with nominal composition FeNb$_{0.8}$Hf$_{0.2}$Sb was prepared by levitation melting of stoichiometric amounts of Fe, Nb, Hf and Sb under an argon atmosphere. The ingot was melted three times to ensure homogeneity. The obtained ingot was mechanically milled to obtain submicron-scale powders (200 nm-2.0 μm in diameter). Then, the obtained powders were compacted by spark plasma sintering at 850° C. for 10 minutes under 65 MPa to obtain the final bulk material FeNb$_{0.8}$Hf$_{0.2}$Sb.

The thermal conductivity κ of the sample FeNb$_{0.8}$Hf$_{0.2}$Sb was 4.44 Wm$^{-1}$K$^{-1}$ at 1200K.

The Seebeck coefficient a and electrical conductivity σ of the sample FeNb$_{0.8}$Hf$_{0.2}$Sb were measured on a commercial Linseis LSR-3 system, which were respectively 199 μV/K and 11×10$^4$ S/m at 1200K.

According to the above values and the formula zT=(a$^2$σT/κ), the zT value of the sample FeNb$_{0.8}$Hf$_{0.2}$Sb was 1.18 at 1200K.

Embodiment 4

The ingot with nominal composition FeNb$_{0.84}$Hf$_{0.16}$Sb was prepared by levitation melting of stoichiometric amounts of Fe, Nb, Hf and Sb under an argon atmosphere. The ingot was melted three times to ensure homogeneity. The obtained ingot was mechanically milled to obtain submicron-scale powders (200 nm-2.0 μm in diameter). Then, the obtained powders were compacted by spark plasma sintering at 850° C. for 10 minutes under 65 MPa to obtain the final bulk material FeNb$_{0.88}$Hf$_{0.12}$Sb.

The thermal conductivity κ of the sample was 5.1 Wm$^{-1}$K$^{-1}$ at 1200K.

The Seebeck coefficient a and electrical conductivity σ of the sample were measured on a commercial Linseis LSR-3 system, which were respectively 209 μV/K and 10.8×10$^4$ S/m at 1100K.

According to the above values and the formula zT= (a$^2$σT/κ), the zT value of the sample was 1.2 at 1200K.

Embodiment 5

The ingot with nominal composition FeNb$_{0.9}$Hf$_{0.1}$Sb was prepared by levitation melting of stoichiometric amounts of Fe, Nb, Hf and Sb under an argon atmosphere. The ingot was melted three times to ensure homogeneity. The obtained ingot was mechanically milled to obtain submicron-scale powders (200 nm-2.0 μm in diameter). Then, the obtained powders were compacted by spark plasma sintering at 850° C. for 10 minutes under 65 MPa to obtain the final bulk material FeNb$_{0.9}$Hf$_{0.1}$Sb.

The thermal conductivity κ of the sample was 4.22 Wm$^{-1}$K$^{-1}$ at 1200K.

The Seebeck coefficient a and electrical conductivity a of the sample were measured on a commercial Linseis LSR-3 system, which were respectively 254 μV/K and 7.2×10$^4$ S/m at 1200K.

According to the above values and the formula zT= (a$^2$σT/κ), the zT value of the sample was 1.32 at 1200K.

Embodiment 6

The ingot with nominal composition FeNb$_{0.92}$Hf$_{0.08}$Sb was prepared by levitation melting of stoichiometric amounts of Fe, Nb, Hf and Sb under an argon atmosphere. The ingot was melted three times to ensure homogeneity. The obtained ingot was mechanically milled to obtain submicron-scale powders (200 nm-2.0 μm in diameter). Then, the obtained powders were compacted by spark plasma sintering at 850° C. for 10 minutes under 65 MPa to obtain the final bulk material FeNb$_{0.92}$Hf$_{0.08}$Sb.

The thermal conductivity κ of the sample was 4.67 Wm$^{-1}$K$^{-1}$ at 1200K.

The Seebeck coefficient a and electrical conductivity σ of the sample were measured on a commercial Linseis LSR-3 system, which were respectively 258 μV/K and 5.92×10$^4$ S/m at 1200K.

According to the above values and the formula zT= (a$^2$σT/κ), the zT value of the sample was 1.01 at 1200K.

Embodiment 7

The ingot with nominal composition FeNb$_{0.94}$Hf$_{0.06}$Sb was prepared by levitation melting of stoichiometric amounts of Fe, Nb, Hf and Sb under an argon atmosphere. The ingot was melted three times to ensure homogeneity. The obtained ingot was mechanically milled to obtain submicron-scale powders (200 nm-2.0 μm in diameter). Then, the obtained powders were compacted by spark plasma sintering at 850° C. for 10 minutes under 65 MPa to obtain the final bulk material FeNb$_{0.94}$Hf$_{0.06}$Sb.

The thermal conductivity κ of the sample was 5.58 Wm$^{-1}$K$^{-1}$ at 1200K.

The Seebeck coefficient a and electrical conductivity σ of the sample were measured on a commercial Linseis LSR-3 system, which were respectively 249.6 μV/K and 4.47×10$^4$ S/m at 1200K.

According to the above values and the formula zT= (a$^2$σT/κ), the zT value of the sample was 0.6 at 1200K.

Figure 3:
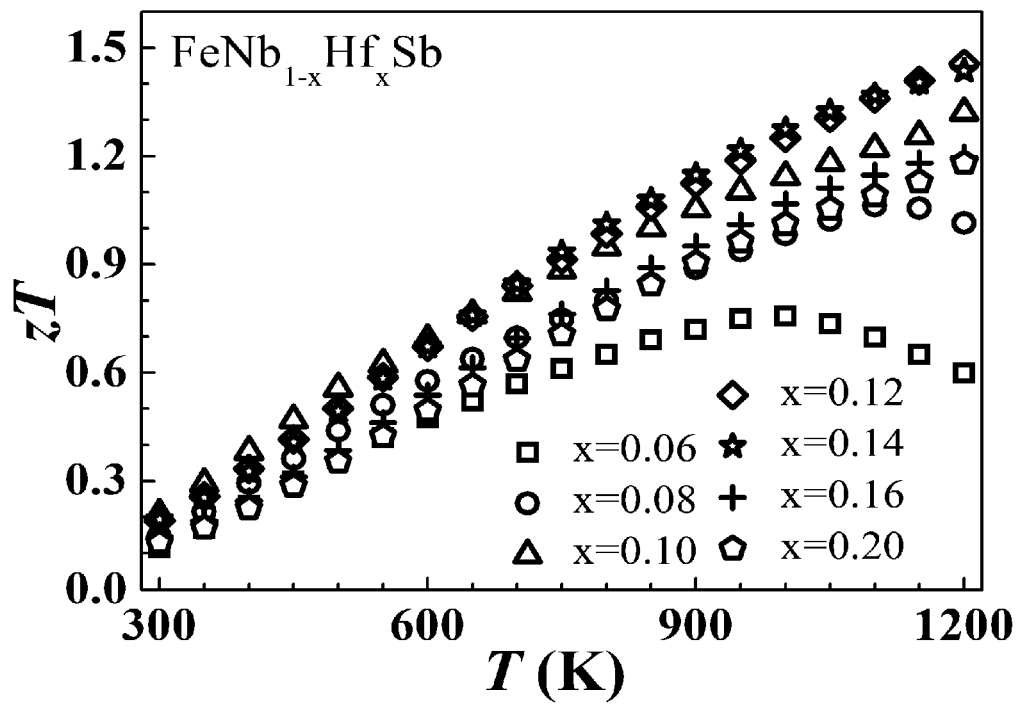
FIG. 3 shows the temperature dependence of zT value for FeNb$_{1-x}$Hf$_x$Sb prepared in embodiments 1-7.

Comprehensive analysis of the thermoelectric properties for the samples in the above embodiments is shown as below:

The temperature dependence of thermoelectric properties for the samples in the above embodiments 1-7 were measured, which are shown in FIG. 2. It can be seen that the thermal conductivity and Seebeck coefficient of the samples decrease with increasing x while the electrical conductivity of the samples increase with increasing x. The final zT of the samples are then calculated by the formula zT=(a$^2$σT/κ), which are shown in FIG. 3. It is found that the zT of all the samples increases with increasing temperature. As the preferred samples, x=0.12 and x=0.14 have the highest zT of 1.45 at 1200K, which is due to their low thermal conductivity (FIG. 2a) and high power factor (FIG. 2d).

The invention claimed is:

1. A p type FeNbHfSb thermoelectric material, whose composition is FeNb$_{1-x}$Hf$_x$Sb, wherein x=0.12-0.14, and a figure of merit (zT) value of 1.4 or greater, x represents atomic percentage of Hf.

2. The p-type FeNbHfSb thermoelectric material of claim 1, wherein x=0.12 or x=0.14.

3. A method to prepare the p-type FeNbHfSb thermoelectric material in claim 1, the method comprises the following steps:
   (1) preparing ingots by levitation melting of stoichiometric amounts of Fe, Nb, Hf and Sb under an argon atmosphere; and
   (2) mechanically milling the ingots of step (1) to obtain powders, compacting the powders by sintering to obtain the p-type FeNbHfSb thermoelectric material.

4. The method of claim 3, wherein raw elements are melted 2-5 times by levitation melting to obtain the ingots in step (1).

5. The method of claim 3, wherein particle size of the obtained powders in step (2) is in the range of 200 nm-10.0 μm.

6. The method of claim 3, wherein the final bulk p type FeNbHfSb thermoelectric material is sintered in step (2) by spark plasma sintering at 800° C.-900° C. for 10 minutes-15 minutes under 60 MPa-70 MPa.

7. The method of claim 6, wherein the p type FeNbHfSb thermoelectric material is sintered in step (2) by spark plasma sintering at 850° C. for 10 minutes under 65 MPa.

* * * * *